United States Patent
Kim et al.

(10) Patent No.: US 11,605,529 B2
(45) Date of Patent: Mar. 14, 2023

(54) PLASMA PROCESSING APPARATUS

(71) Applicant: Samsung Electronics Co., Ltd., Suwon-si (KR)

(72) Inventors: Hakyoung Kim, Bucheon-si (KR); Kyeongtea Bang, Hwaseong-si (KR); Dougyong Sung, Seoul (KR)

(73) Assignee: Samsung Electronics Co., Ltd.

( * ) Notice: Subject to any disclaimer, the term of this patent is extended or adjusted under 35 U.S.C. 154(b) by 9 days.

(21) Appl. No.: 17/215,232

(22) Filed: Mar. 29, 2021

(65) Prior Publication Data
US 2022/0051873 A1    Feb. 17, 2022

(30) Foreign Application Priority Data
Aug. 13, 2020   (KR) ......................... 10-2020-0101757

(51) Int. Cl.
*H01J 37/32*   (2006.01)

(52) U.S. Cl.
CPC .... *H01J 37/3244* (2013.01); *H01J 37/32715* (2013.01)

(58) Field of Classification Search
CPC ........... H01J 37/32082; H01J 37/32119; H01J 37/32449; H01J 37/32715
See application file for complete search history.

(56) References Cited

U.S. PATENT DOCUMENTS

| | | | |
|---|---|---|---|
| 7,600,522 B2 | 10/2009 | Sato et al. | |
| 7,785,417 B2 * | 8/2010 | Ni | H01J 37/3244 156/345.33 |
| 8,137,463 B2 | 3/2012 | Liu et al. | |
| 9,536,710 B2 | 1/2017 | Knyazik et al. | |
| 9,767,993 B2 * | 9/2017 | Ishibashi | H01J 37/32495 |
| 10,262,867 B2 | 4/2019 | Sriraman et al. | |
| 10,395,900 B2 | 8/2019 | Kim et al. | |
| 10,607,817 B2 * | 3/2020 | Franklin | H01J 37/32449 |
| 2003/0070620 A1 * | 4/2003 | Cooperberg | H01J 37/321 118/723 AN |
| 2009/0221149 A1 * | 9/2009 | Hammond, IV | H01J 37/32449 156/345.33 |
| 2009/0311872 A1 * | 12/2009 | Ueda | C23C 16/4558 438/758 |

(Continued)

FOREIGN PATENT DOCUMENTS

JP    2012015180 A    1/2012

*Primary Examiner* — Tung X Le
(74) *Attorney, Agent, or Firm* — Myers Bigel, P.A.

(57) ABSTRACT

A plasma processing apparatus includes a chamber; a support member in the chamber; a window plate at an upper portion of the chamber and including a window plate body and a fastening hole, wherein the fastening hole includes a lower fastening hole portion and an upper fastening hole portion. and a gas injector including a first body having a plurality of distribution nozzles and a second body having an accommodating groove to which the first body is fastened and a plurality of injection nozzles. The second body includes a first portion disposed inside the upper fastening hole portion, a second portion disposed inside the lower fastening hole portion, and a third portion disposed below the window plate. The second portion of the second body includes a gas hole extending from the accommodating groove to an external side surface of the second portion of the second body.

19 Claims, 9 Drawing Sheets

(56) References Cited

U.S. PATENT DOCUMENTS

2010/0327085 A1    12/2010  Ni et al.
2019/0385816 A1*   12/2019  Hsu .................. H01L 21/67069
2020/0047222 A1*    2/2020  Won .................. C23C 16/45565

* cited by examiner

PLASMA PROCESSING APPARATUS

CROSS-REFERENCE TO RELATED APPLICATION

This application claims the benefit of priority to Korean Patent Application No. 10-2020-0101757, filed on Aug. 13, 2020, in the Korean Intellectual Property Office, the disclosure of which is incorporated herein by reference in its entirety.

BACKGROUND

The present inventive concept relates to plasma processing apparatus.

A plasma processing apparatus is commonly used for manufacturing semiconductor devices, Light Emitting Diodes (LEDs), Liquid Crystal Displays (LCDs), or the like. Thereamong, an ICP-type etching apparatus includes a hole in the center of a window plate, an RF Power transmission path, and a nozzle mounted in the hole to inject a process gas into a chamber. A process gas is excited to a plasma state inside the chamber to perform a semiconductor process.

SUMMARY

An aspect of the present inventive concept is to provide a plasma processing apparatus capable of implementing uniform dispersion of a process gas inside a chamber.

According to example embodiments of the present inventive concept, a plasma processing apparatus includes a chamber; a support member inside the chamber; a window plate at an upper portion of the chamber and facing the support member, wherein the window plate includes a window plate body and a fastening hole penetrating the window plate body, wherein the fastening hole includes a lower fastening hole portion having a first width and an upper fastening hole portion having a second width, greater than the first width; and a gas injector including a first body having a plurality of distribution nozzles configured to distribute process gas and a second body having an accommodating groove to which the first body is fastened and a plurality of injection nozzles configured to inject the process gas distributed by the plurality of distribution nozzles into an internal space of the chamber, wherein the second body includes a first portion disposed inside the upper fastening hole portion, a second portion disposed inside the lower fastening hole portion, and a third portion disposed below the window plate, wherein the second portion of the second body includes a gas hole extending from the accommodating groove to an external side surface of the second portion of the second body.

According to example embodiments of the present inventive concept, a plasma processing apparatus includes a chamber; a support member inside the chamber; a window plate at an upper portion of the chamber and facing the support member, wherein the window plate includes a window plate body and a fastening hole penetrating the window plate body; a gas injector including a first body having a plurality of distribution nozzles configured to distribute process gas and a second body having a first accommodating groove to which the first body is fastened, a second accommodating groove surrounding the first accommodating groove, and a plurality of injection nozzles configured to inject the process gas distributed by the plurality of distribution nozzles into an internal space of the chamber; and a gap between the gas injector and the window plate, wherein the second body includes an upper portion disposed in the fastening hole of the window plate, and a lower portion disposed below the window plate, the gap is between an external side surface of the upper portion of the second body and an internal side surface of the window plate, and the upper portion of the second body includes a gas hole extending from the second accommodating groove to the external side surface of the upper portion of the second body to connect the second accommodating groove and the gap.

According to example embodiments of the present inventive concept, a plasma processing apparatus includes a chamber; a support member inside the chamber; a window plate at an upper portion of the chamber, facing the support member and including a fastening hole; a gas injector fastened to the fastening hole and including a first body and a second body having an accommodating groove to which the first body is fastened; and a gap between the gas injector and the window plate, wherein the gas injector includes an upper portion disposed inside the fastening hole of the window plate and a lower portion disposed below the window plate, the gas injector further including a gas hole extending from the accommodating groove to an external side surface of the upper portion of the second body to fluidly connect the accommodating groove and the gap.

BRIEF DESCRIPTION OF DRAWINGS

The above and other aspects, features and other advantages of the present inventive concept will be more clearly understood from the following detailed description, taken in conjunction with the accompanying drawings, in which.

DETAILED DESCRIPTION

Hereinafter, the preferred embodiments of the present inventive concept will be described with reference to the accompanying drawings.

Figure 1:
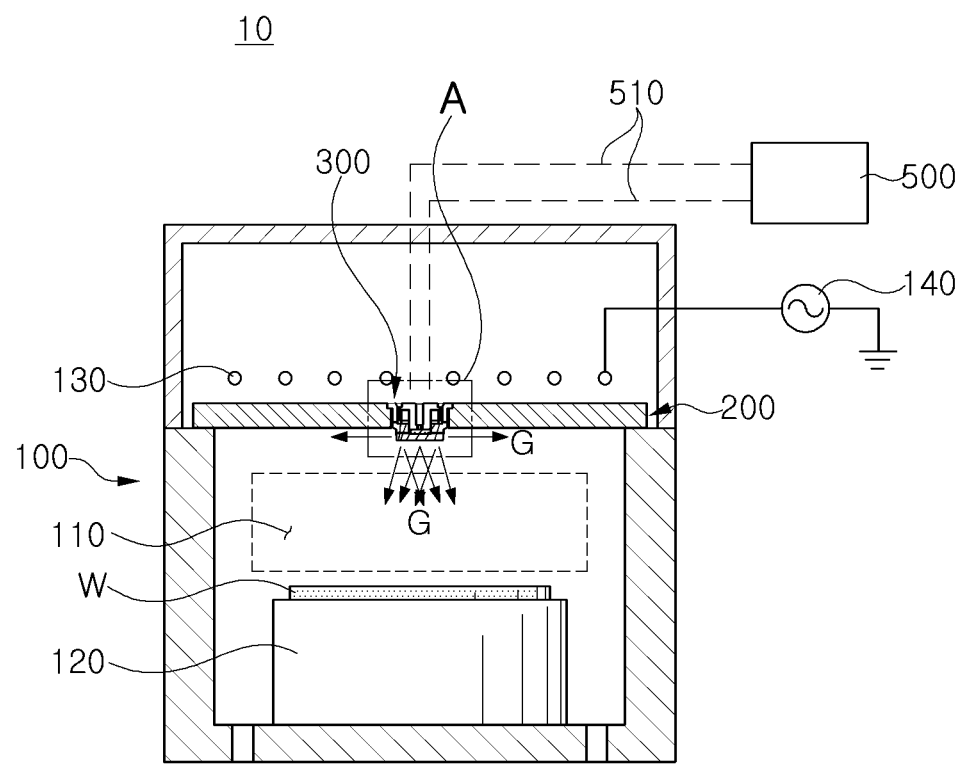
FIG. 1 is a cross-sectional view schematically illustrating a plasma processing apparatus according to example embodiments.

FIG. 1 is a cross-sectional view schematically illustrating a plasma processing apparatus according to example embodiments.

Figure 2A:
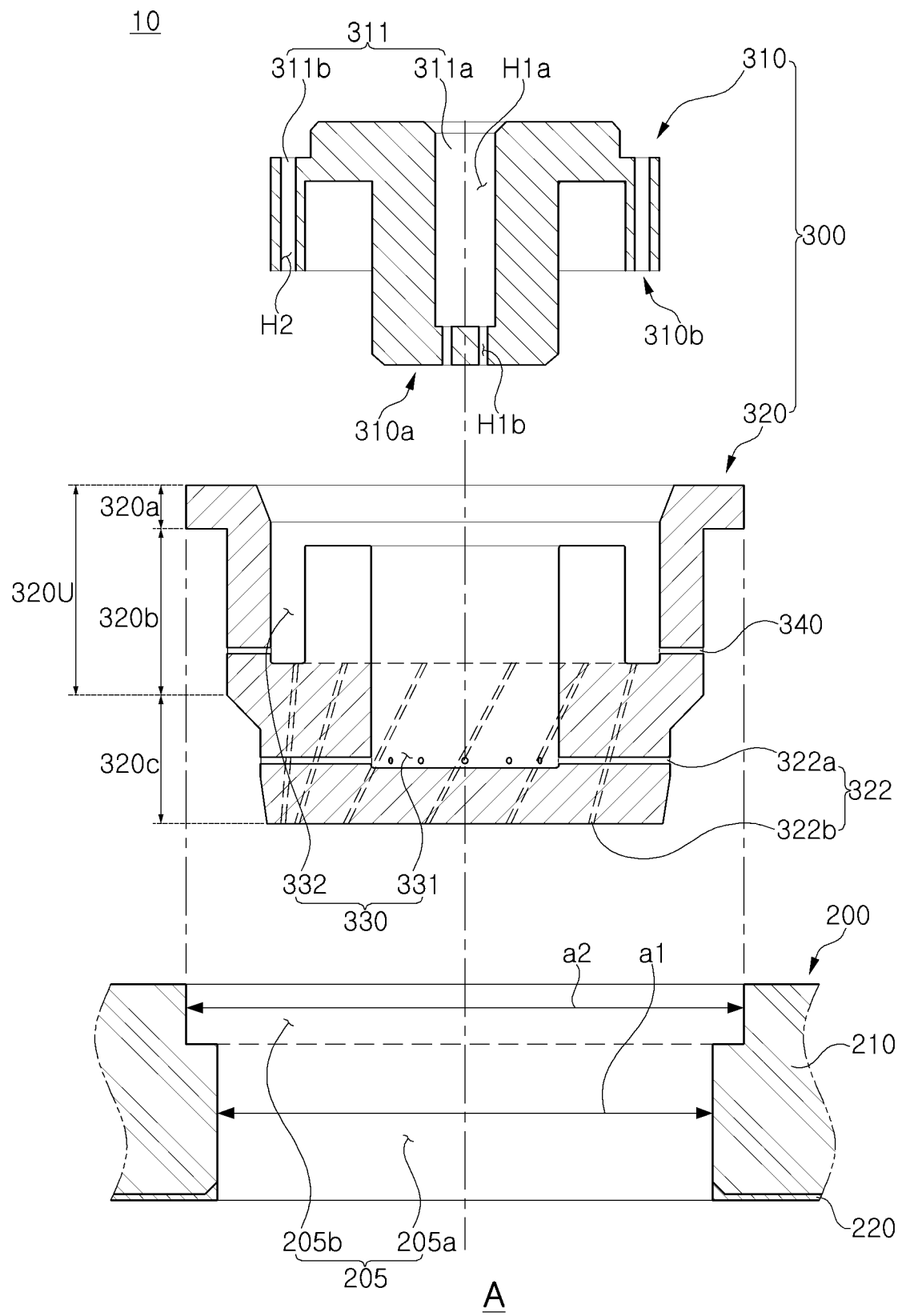
FIGS. 2A and 2B are partially enlarged views schematically illustrating a plasma processing apparatus according to example embodiments.
Figure 2B:
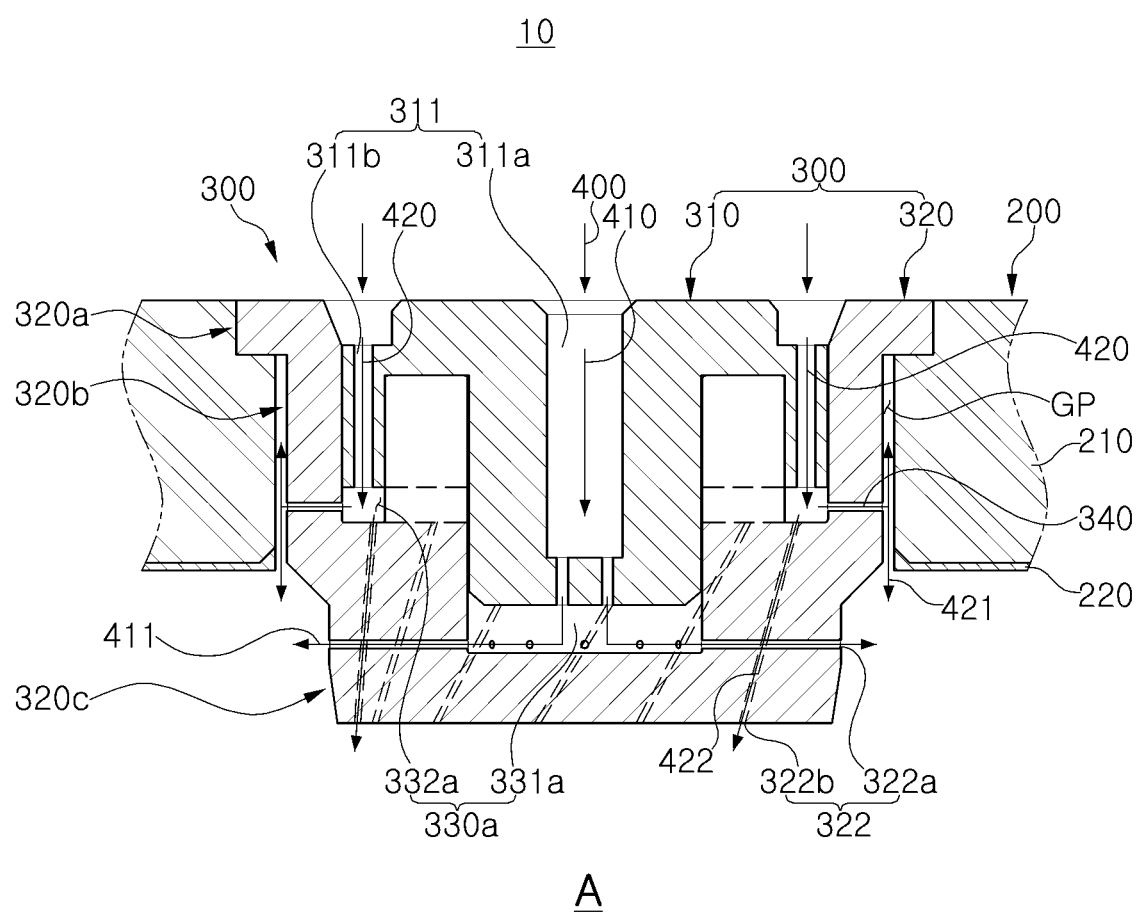

FIGS. 2A and 2B are partially enlarged views schematically illustrating a plasma processing apparatus according to example embodiments. FIG. 2A is an enlarged view of disassembly of components of region "A" of FIG. 1 before a gas injector 300 is fastened to a window plate 200. FIG. 2B is an enlarged view of assembly of components of region "A" of FIG. 1 after the gas injector 300 is fastened to the window plate 200.

With reference to FIGS. 1 to 2B, a plasma processing apparatus 10 may include a chamber 100, a support member 120 disposed inside the chamber 100, a window plate 200, a gas injector 300 and an ICP antenna 130.

In example embodiments, the plasma processing apparatus 10 may further include a gap between the window plate 200 and the gas injector 300.

The chamber 100 may provide an internal space 110 in which a processing process is performed with respect to a wafer W. A plasma for a semiconductor process may be formed in the internal space 110 of the chamber 100, and the chamber 100 or the internal space 110 may be referred to as a "plasma processing region" or "plasma region."

The support member 120 may be disposed inside the chamber 100. A wafer W for manufacturing a semiconductor device may be disposed in or on the support member 120. The support member 120 may include, for example, an electrostatic chuck (ESC).

The window plate 200 may include a window plate body 210, a protective layer 220 and a fastening hole 205. The window plate 200 is disposed in an upper portion of the chamber 100 and may face the support member 120. The window plate 200 is disposed in an upper portion of the chamber 100 to seal the internal space 110 of the chamber 100.

The window plate body 210 may be formed of a dielectric. The window plate body 210 may be formed of, for example, a non-conductive ceramic, such as $Al_2O_3$, quartz, or the like, but is not limited thereto. The window plate body 210 may have a step in a central region thereof, penetrating the fastening hole 205.

The fastening hole 205 is located approximately in a central region of the window plate body 210 and may penetrate the window plate body 210. The gas injector 300 is inserted into the fastening hole 205 to be fastened to the window plate 200.

In an example embodiment, the fastening hole 205 may have a lower fastening hole or lower fastening hole portion 205a and an upper fastening hole or upper fastening hole portion 205b. The lower fastening hole 205a and upper fastening hole 205b may have different widths or diameters. The lower fastening hole 205a may have a first width or first diameter a1, while the upper fastening hole 205b may have a second width or second diameter a2, greater than the first width a1. The gas injector 300 may be disposed inside the fastening hole 205.

The protective layer 220 may be disposed on a lower surface of the window plate body 210 exposed to the internal space 110 of the chamber 100. The protective layer may be formed of a material having excellent etching resistance, for example, yttrium oxide ($Y_2O_3$).

In an example embodiment, the protective layer 220 may be formed of a material the same as that of the gas injector 300. The protective layer may be formed by, for example, coating a lower surface of the window plate body 210 to a thickness of several tens to several hundred μm.

The gas injector 300 may include a first body 310 and a second body 320. The first body 310 may be fastened to the second body 320. The gas injector 300 may be detachably mounted on the fastening hole 205 of the window plate 200. The gas injector 300 may protrude from a lower surface of the window plate 200 while being fastened to the fastening hole 205. The gas injector 300 may be connected through a tank 500 storing a process gas G and a supply pipe 510 connecting the tank 500 and the gas injector 300. The gas injector 300 may inject the process gas G into the internal space 110 of the chamber 100. The gas injector 300 may be made of a material having excellent etching resistance, for example, yttrium oxide ($Y_2O_3$), $SiO_2$, quartz, ceramic, or the like.

The first body 310 may include a plurality of distribution nozzles 311 configured to distribute the process gas G. The plurality of distribution nozzles 311 may include a first distribution nozzle 311a and a second distribution nozzle 311b. The first distribution nozzle 311a may include a cylindrical through-hole in a center of the first body 310. The through-hole of the first distribution nozzle 311a may include a first through-hole H1a having a large surface area or diameter or width in an upper portion of the first distribution nozzle 311a and a second through-hole H1b having a smaller surface area or diameter or width than the first through-hole H1a. The second distribution nozzle 311b may include a third through-hole H2 penetrating the first body 310 around or surrounding the first distribution nozzle 311a. The first distribution nozzle 311a may be disposed inside a first or inner portion 310a of the first body 310, and the second distribution nozzle 311b may be disposed inside a second or outer portion 310b of the first body.

The first body 310 may include the first portion 310a including the first distribution nozzle 311a and the second portion 310b including the second distribution nozzle 311b. A lower surface of the first portion 310a of the first body 310 may protrude from a lower surface of the second portion 310b of the first body 310. That is, the lower surface of the first portion 310a of the first body 310 may be disposed on a level lower than the lower surface of the second portion 310b of the first body 310. In other words, the first portion 310a of the first body 310 may extend downwardly further than the second portion 310b of the first body 310.

The second body 320 may include a first portion 320a disposed inside the upper fastening hole 205b, a second portion 320b disposed inside the lower fastening hole 205a, and a third portion 320c disposed or extending below the window plate 200. The first portion 320a and the second portion 320b of the second body 320 may be referred to as an upper portion 320U of the second body 320. The third portion 320c of the second body 320 may be referred to as a lower portion of the second body 320. The first portion 320a of the second body 320 is disposed on the second portion 320b of the second body 320, and the second portion 320b of the second body 320 may be disposed on the third portion 320c of the second body 320. The first to third portions 320a to 320c of the second body 320 may be connected to each other. Each of the first to third portions 320a to 320c of the second body 320 may have different widths or diameters. In the present specification, a diameter may be the average diameter or the largest diameter of each of the first to third portions. The third portion 320c of the second body 320 may include a portion extending in a diagonal direction from the second portion 320b. The first and second portions 320a and 320b of the second body 320 may be disposed inside the fastening hole 205. The first portion 320a of the second body 320, as a locking jaw, is mounted on an upper surface of the window plate 200 having a step in a state of being inserted into the fastening hole 205 of the window plate 200 to prevent the second body 320 from falling downwardly. The first portion 320a of the second body 320 is disposed inside the upper fastening hole 205b (e.g., on the step) and may be disposed on the window plate body 210 through which the lower fastening hole 205a passes. The second portion 320b of the second body 320 may include at least one gas hole 340. The third portion 320c of the second body 320 may include injection nozzles 322 connected to or extending to an outer surface of the third portion 320c.

The second body 320 may include an accommodating groove 330 to which the first body 310 is fastened, the plurality of injection nozzles 322 for injecting process gas G, and the at least one gas hole 340.

The accommodating groove 330 has a shape corresponding to the first body 310, and the first body 310 may be inserted into and fastened to the accommodating groove 330 of the second body 320. The accommodating groove 330 may include a first accommodating groove 331 disposed in a central portion of the second body 320 and a second accommodating groove 332 disposed around or surrounding the first accommodating groove 331.

A bottom surface of the first accommodating groove 331 may be located on a level lower than a bottom surface of the second accommodating groove 332. In other words, the first accommodating groove 331 may extend downwardly further than the second accommodating groove 332. The first accommodating groove 331 may be fastened to or receive the first portion 310a of the first body 310, and the second accommodating groove 332 may be fastened to or receive the second portion 310b of the first body 310. The bottom surface of the second accommodating groove 332 may be disposed in the third portion 320c of the second body 320. In an example embodiment, the bottom surface of the first accommodating groove 331 may be disposed below the bottom surface of the window plate 200. The lower surface of the first portion 310a of the first body 310 fastened to the first accommodating groove 331 may be disposed inside the third portion 320c of the second body 320. The lower surface of the first portion 310a of the first body 310 fastened to the first accommodating groove 331 may be positioned on a level lower than a lower surface of the window plate 200.

The first accommodating groove 331 may include a first space 331a accommodating the process gas G in the first body 310 fastened to the first accommodating groove 331, and the second accommodating groove 332 may include a second space 332a accommodating the process gas G in the first body 310 fastened to the second accommodating groove 332. A lower surface of the first body 310, to which the first and second distribution nozzles 311a and 311b are connected, is not in contact with the bottom surfaces of the first and second accommodating grooves 331 and 332 and is spaced apart by a predetermined distance. The first space 331a and the second space 332a may correspond to a type of reservoir. In the first space 331a and the second space 332a, the process gas G is uniformly distributed and uniformly injected into the chamber 100.

The plurality of injection nozzles 322 may include a first injection nozzle 322a and a second injection nozzle 322b. The plurality of injection nozzles 322 may inject the process gas G distributed by the plurality of distribution nozzles 311 into the internal space 110 of the chamber 100.

The first injection nozzle 322a may extend radially from the first accommodating groove 331 and be connected to or extend to an external side surface of the third portion 320c of the second body 320. The first injection nozzle 322a may include a hole or channel penetrating or extending between the first accommodating groove 331 and the external side surface of the third portion 320c of the second body 320. The process gas G may be injected in a lateral direction of the gas injector 300 by the first injection nozzle 322a.

The second injection nozzle 322b extends downwardly from the second accommodating groove 332 and may be connected to or extend to a lower surface of the third portion 320c of the second body 320. The second injection nozzle 322b may include a hole or channel penetrating or extending between the second accommodating groove 332 and the lower surface of the third portion 320c of the second body 320. The process gas G may be injected in a downward direction of the gas injector 300 by the second injection nozzle 322b.

The process gas G is injected through the first injection nozzle 322a and the second injection nozzle 322b in different directions, such that mixing in the internal space 110 of the chamber 100 may be increased. This brings about the effect of improving the distribution of the process gas G in the internal space 110 of the chamber 100 and improves yields of products.

A gap GP may be a space between an internal side surface of the window plate 200 and an external side surface of the gas injector 300. The gap GP may be a space between the internal side surface of the window plate 200 and the external side surface of the second portion 320b of the second body 320. A width of the gap GP may range from about 0.1 mm to about 1.0 mm. A distance between the internal side surface of the window plate 200 and the external side surface of the gas injector 300 may range from about 0.1 mm to about 1.0 mm. For example, a distance between the internal side surface of the window plate 200 and the external side surface of the second portion 320b of the second body 320 may range from about 0.1 mm to about 1.0 mm.

A gas hole or channel 340 may extend from the accommodating groove 330 and connect the accommodating groove 330 and the external side surface of the second body 320 facing the window plate 200. The gas hole 340 may extend from the second accommodating groove 332 and connect the second accommodating groove 332 and the external side surface of the second body 320 facing the window plate 200. The gas hole 340 may extend from the second accommodating groove 332 and connect the second accommodating groove 332 and the external side surface of the second portion 320b of the second body 320. The gas hole 340 may penetrate or extend between the second accommodating groove 332 and the external side surface of the second portion 320b of the second body 320. The gas hole 340 may extend from the second space 332a and connect the second space 332a and the external side surface of the second portion 320b of the second body 320. The gas hole 340 may extend from the second accommodating groove 332 to the external side surface of the second portion 320b of the second body 320 to connect the second accommodating groove 332 and the gap GP.

A portion of process gas 420 distributed by the second distribution nozzle 311b, among the distribution nozzles 311, may be injected toward an internal side surface of the window plate 200 through the gas hole 340. Process gas 421 injected toward the internal side surface of the window plate 200 through the gas hole 340 may flow along the internal side surface of the window plate 200. As partial pressure inside the gap GP increases due to the process gas 421 injected through the gas hole 340, the plasma formed in the internal space 110 of the chamber 100 is prevented from flowing into the gap GP, thereby suppressing generation of process particles. The process gas 421 injected toward the internal side surface of the window plate 200 through the gas hole 340 flows downwardly along the internal side surface of the window plate 200 such that the process particles which may be generated by the plasma are prevented from being deposited in the gap GP.

As the gas injector 300 has a two-piece structure in which the first body 310 for uniformly distributing the process gas G and the second body 320 for uniformly injecting the distributed process gases 410 and 420 can be separated, it is possible to reduce maintenance costs by replacing only the second body 320 exposed to the plasma formed in the internal space 110 of the chamber 100.

The process gas 400 incident to the gas injector 300 may be divided into a process gas 410 flowing through the first distribution nozzle 311a and a process gas 420 flowing through the second distribution nozzle 311b.

The process gas 410 flowing through the first distribution nozzle 311a is distributed through the first distribution nozzle 322a in the first space 331a of the first accommodating groove 331 to be injected from the external side surface of the second body 320. The process gas 410 flowing through the first distribution nozzle 311a may be injected from the external side surface of the third portion 320c of the second body 320. That is, the process gas 411 injected through the first injection nozzle 322a may be injected from the external side surface of the third portion 320c of the second body 320 that is protruding downwardly from the window plate 200. The process gas 411 injected through the first injection nozzle 322a may be injected in the lateral direction of the gas injector 300.

The process gas 420 flowing through the second distribution nozzle 311b may be divided into process gas 421 injected from the second space 332a of the second accommodating groove 332 through the gas hole 340 and process gas 422 injected through the second injection nozzle 322b. The process gas 421 injected through the gas hole 340 may fill the gap GP. In an example embodiment, the process gas 421 injected through the gas hole 340 may flow in a downward direction of the chamber 100 along the internal side surface of the window plate 200. A gas flow rate of the process gas 421 injected through the gas hole 340 may be lower than that of the process gas 422 injected through the second injection nozzle 322b.

The ICP antenna 130 may be disposed in an upper portion of the chamber 100 or the window plate 200. The ICP antenna 130 may be connected to a plasma power supply 140 to form an electromagnetic field in the internal space 110 of the chamber 100.

The gas injector 300 will be described in more detail with reference to FIGS. 3A to 3C.

Figure 3A:
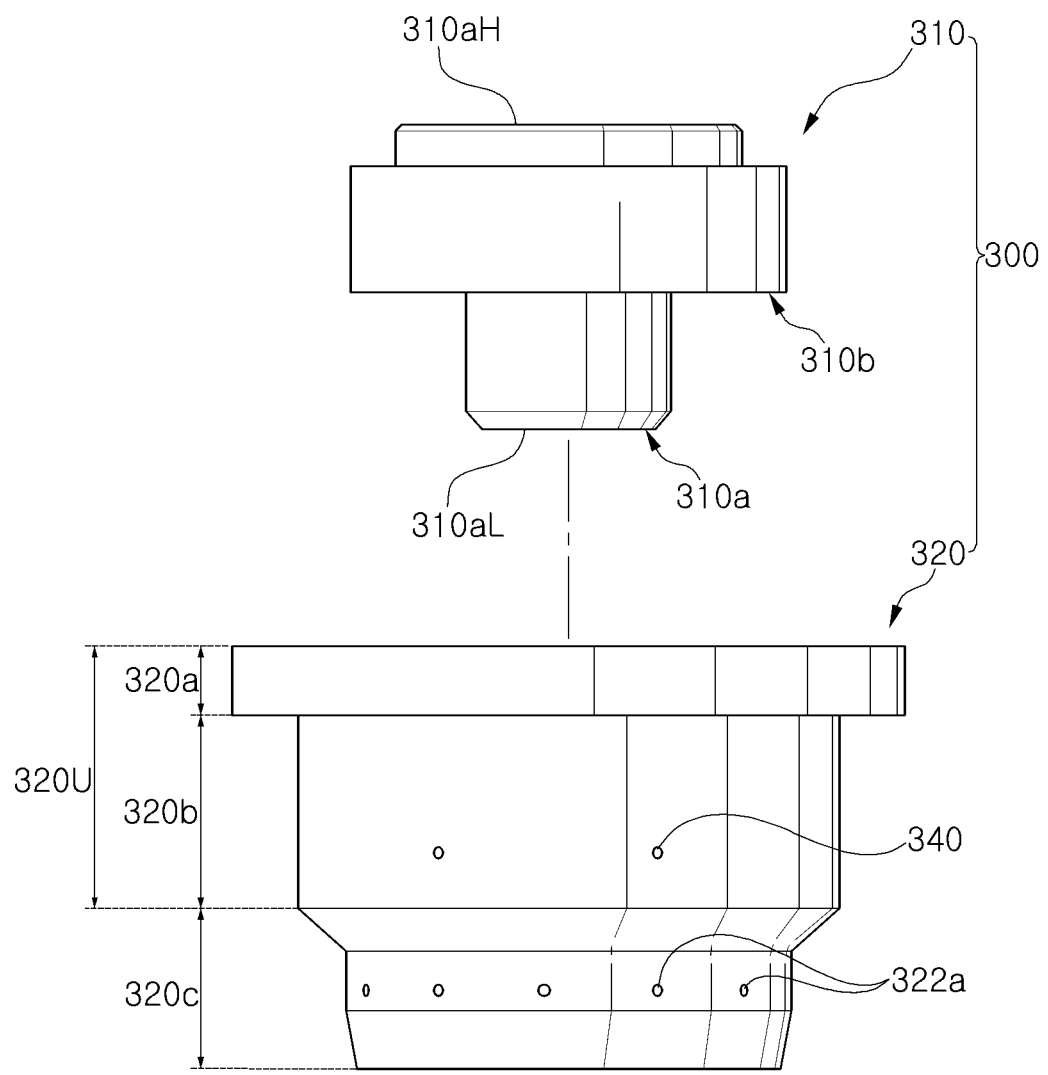
FIGS. 3A and 3B are a side view and a perspective view schematically illustrating a gas injector in the plasma processing apparatus of FIG. 1.
Figure 3B:
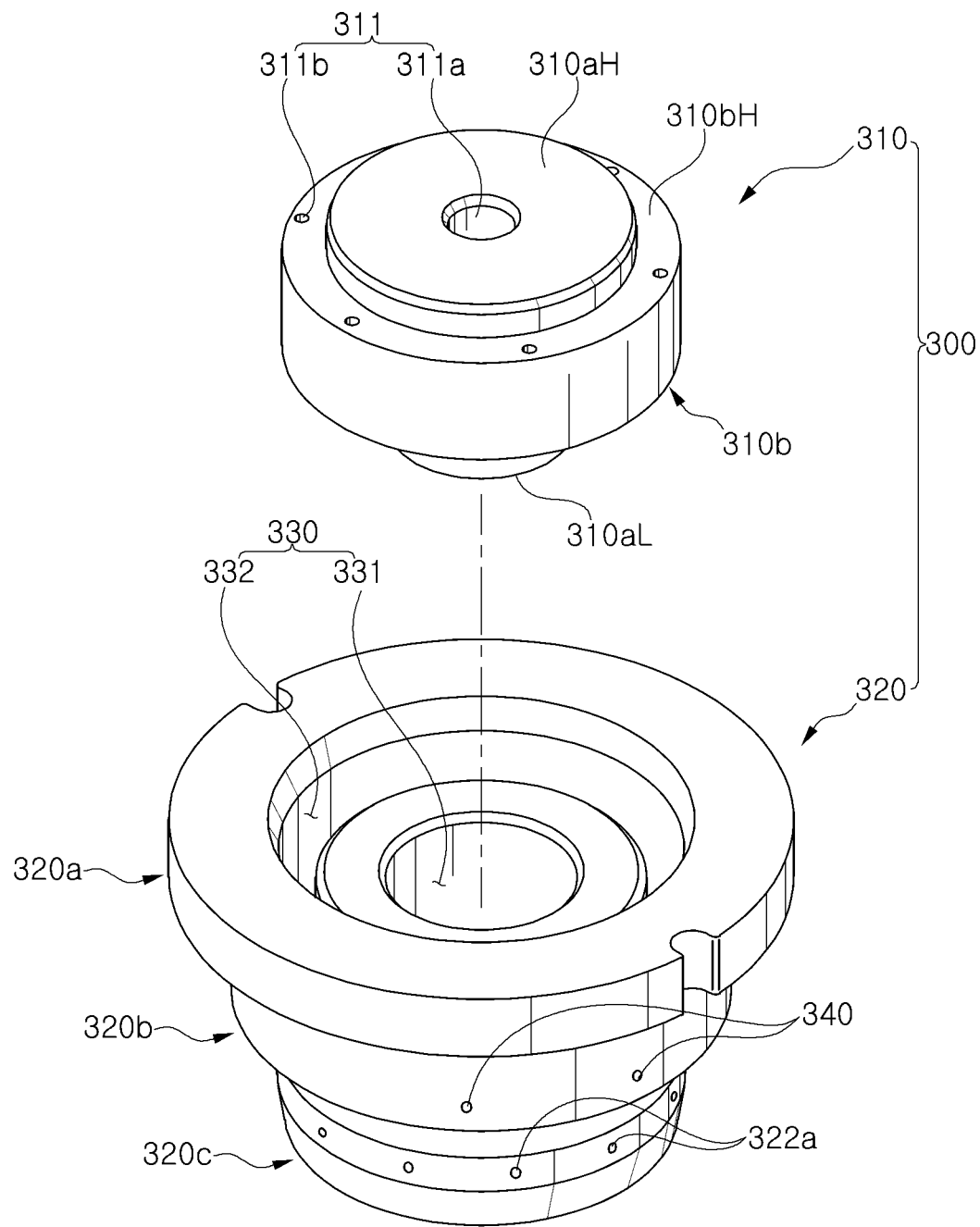

FIGS. 3A and 3B are a side view and a perspective view schematically illustrating a gas injector in the plasma processing apparatus of FIG. 1.

Figure 3C:
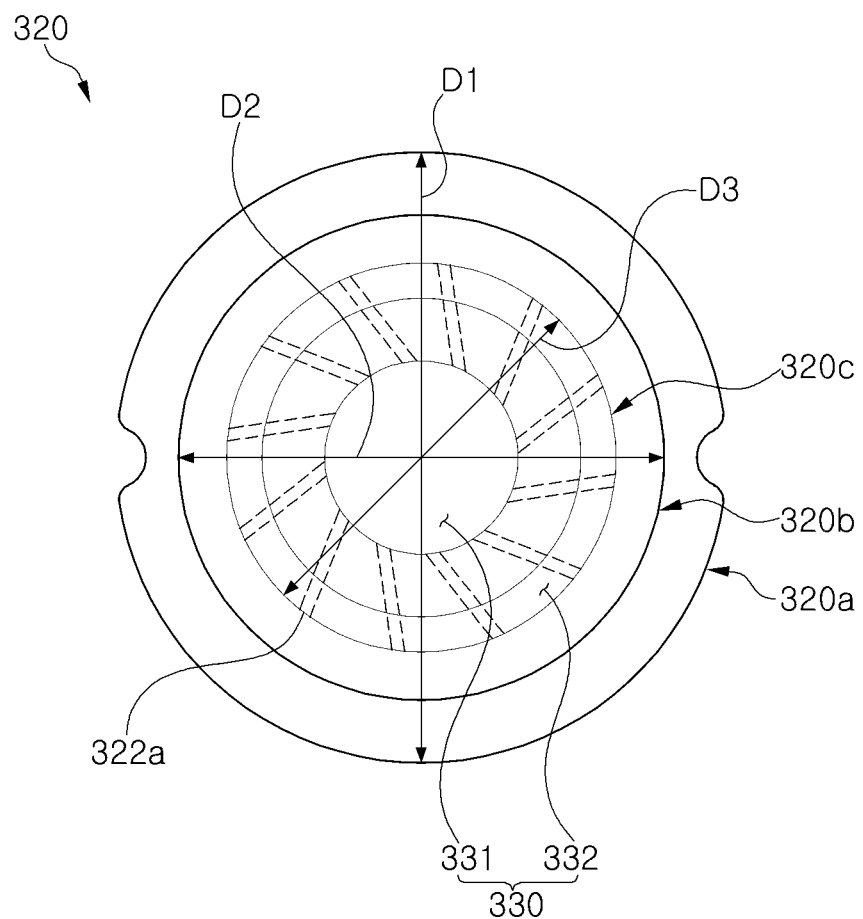
FIG. 3C is a planar view schematically illustrating a second body of a gas injector.

FIG. 3C is a planar view schematically illustrating a second body of a gas injector.

With reference to FIGS. 3A and 3B, the gas injector 300 may include a first body 310 and a second body 320, which can be fastened to each other.

The first body 310 may include a first portion 310a disposed at a center of the first body 310 and a second portion 310b disposed at a higher level than a lower surface of the first portion 310a. The first distribution nozzle 311a may penetrate the first portion 310a of the first body 310, and the second distribution nozzle 311b may penetrate the second portion 310b of the first body 310. As illustrated in FIGS. 3A and 3B, the first portion 310a and the second portion 310b of the first body 310 may be connected to each other. The first portion 310a of the first body 310 may include a first lower surface 310aL in a lowermost portion and a first upper surface 310aH in an uppermost portion. The first lower surface 310aL and the first upper surface 310aH include holes through which the first distribution nozzle 311a passes and may thus have a ring shape. The first lower surface 310aL may have a width or diameter smaller than that of the first upper surface 310aH. A second upper surface 310bH, which is an uppermost surface of the second portion 310b of the first body 310, may be disposed around or surrounding the first upper surface 310aH. The first lower surface 310aL of the first portion 310a may have a width or diameter smaller than that of the second upper surface 310bH of the second portion 310b.

The second body 320 may include a first portion 320a, a second portion 320b and a third portion 320c each having different widths. Each of the first to third portions 320a to 320c of the second body 320 may have a circular outline or circumference. The first portion 320a of the second body 320 may be disposed on the second portion 320b of the second body 320, and the second portion 320b of the second body 320 may be disposed on the third portion 320c of the second body 320. As illustrated in FIGS. 3A and 3B, the first to third portions 320a to 320c of the second body 320 may be connected to each other.

The first portion 320a of the second body 320 is disposed in or at an uppermost portion of the second body 320 and may have an external side surface having a largest width or diameter in the second body 320. The second portion 320b of the second body 320 may include a gas hole 340 connected to the external side surface of the second portion 320b. The third portion 320c of the second body 320 may include a first injection nozzle 322a connected to an external side surface and a second injection nozzle connected to a lower surface thereof.

The second body 320 may include a first accommodating groove 331 disposed in a central portion of the second body 320 and a second accommodating groove 332 disposed around or surrounding the first accommodating groove 331. The first accommodating groove 331 may have a substantially cylindrical structure. The second accommodating groove 332 may have a ring-shaped structure surrounding the first accommodation groove 331.

When the first body 310 and the second body 320 are fastened to each other as illustrated in FIG. 2B, the first distribution nozzle 311a may be located inside the first accommodating groove 331, and the second distribution nozzle 311b may be located inside the second accommodating groove 332.

A number of the gas holes 340 may be smaller than the number of each of the distribution nozzles 311, the first injection nozzles 332a and the second injection nozzles connected to a lower surface of the second body 320.

With reference to FIG. 3C, each of the first to third portions 320a to 320c of the second body 320 may have a circular outline or circumference. In an example embodiment, each of the first to third portions 320a to 320c of the second body 320 may have different diameters. The first portion 320a of the second body 320 may have a first diameter D1, and the second portion 320b of the second body 320 may have a second diameter D2, smaller than the first diameter D1, while the third portion 320c of the second body 320 may have a third diameter D3, smaller than the second diameter D2.

The first diameter D1 of the first portion 320a of the second body 320 may be substantially the same as the second width a2 of the upper fastening hole 205b in FIG. 2A. The first diameter D1 of the first portion 320a of the second body 320 may be greater than the first width a1 of the lower fastening hole 205a in FIG. 2A. In an example embodiment, the first diameter D1 of the first portion 320a of the second body 320 may be smaller than the second width a2 of the upper fastening hole 205b in FIG. 2A; however, even in this case, the first diameter D1 of the first portion 320a of the second body 320 may be greater than the first width a1 of the lower fastening hole 205a.

The second diameter D2 of the second portion 320b of the second body 320 may be smaller than the first width a1 of the lower fastening hole 205a. A difference between the first width a1 of the lower fastening hole 205a and the second diameter D2 of the second portion 320c of the second body 320 may range from about 0.1 mm to 1.0 mm.

Figure 4A:
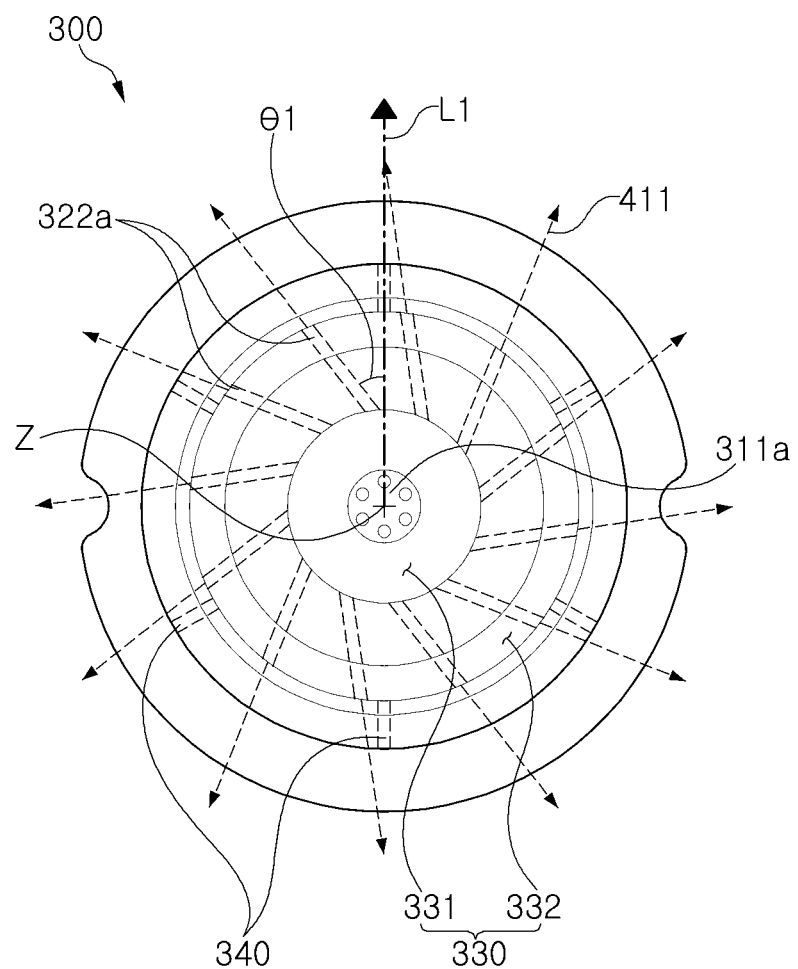
FIG. 4A is a planar view schematically illustrating a gas injector in a plasma processing apparatus.

FIG. 4A is a planar view schematically illustrating a gas injector in a plasma processing apparatus.

Referring to FIG. 4A, the first injection nozzles 322a may form an acute angle θ1 with respect to a virtual straight line L1 extending in a normal direction from a central axis Z of the first accommodating groove 331 based on a point or path in which the virtual straight line L1 and the internal side surface of the first accommodating groove 331 meet. Rotation directions of the first injection nozzles 322a may all be the same. In the present example embodiment, the first injection nozzles 322a are illustrated as having a structure of being rotated counterclockwise, but are not limited thereto, and may have a structure of being rotated clockwise. In the case of the process gas 411 radially injected in the lateral direction of the gas injector 300, the first injection nozzle 322a has a structure of being rotated at a predetermined angle with respect to the normal direction, such that the injected process gas 411 rotates along a circumference of the gas injector 300 and diffuses radially, thereby forming a flow field.

The gas holes 340 may be formed in an area radially outside the first injection nozzle 322a from the central axis Z of the first accommodating groove 331. A number of gas holes 340 may be smaller than that of first injection nozzles 322a, but the inventive concept is not limited thereto.

Figure 4B:
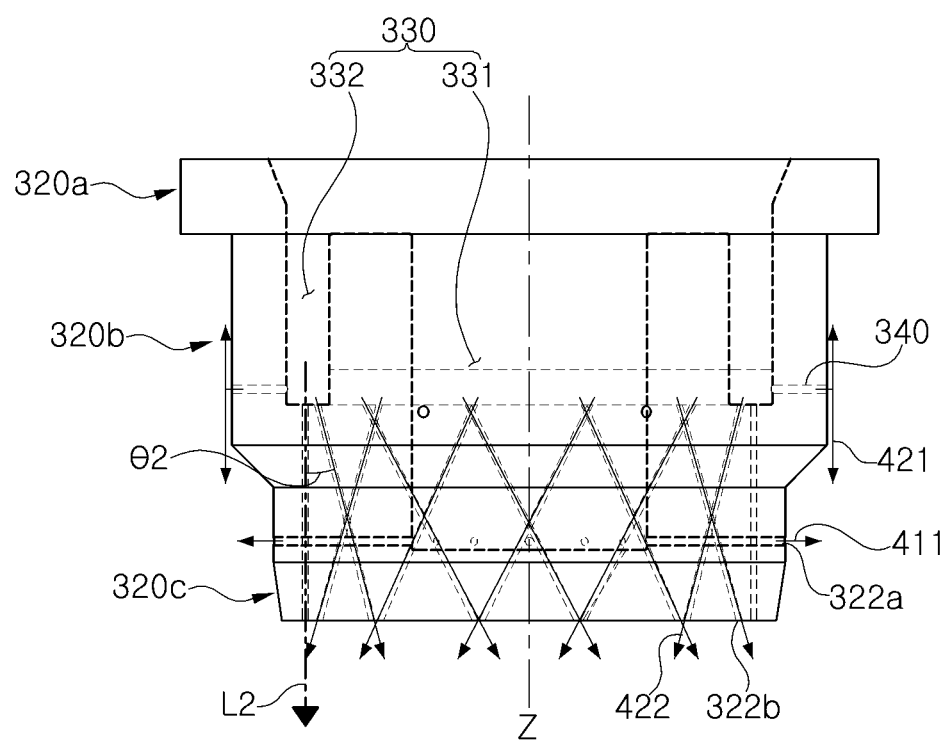
FIG. 4B is a cross-sectional view schematically illustrating a gas injector in a plasma processing apparatus.

FIG. 4B is a cross-sectional view schematically illustrating a gas injector in a plasma processing apparatus.

Referring to FIG. 4B, the second injection nozzles 322b form an acute angle θ2 with an arbitrary vertical line L2 parallel to the central axis Z of the first accommodating groove 331 and may have a structure extending obliquely in the same direction along the circumferential direction toward the bottom surface of the second body 320. In the case of the process gas 422 injected downwardly from the gas injector 300, the second injection nozzle 322b has a structure obliquely extending downwardly along the circumferential direction of the gas injector 300, and thus, the injected process gas 422 may form a spirally rotating vortex and form a diffusing flow field.

Referring to FIGS. 4A and 4B together, the process gas G injected in a lateral direction and a lower direction of the gas injector 300 is injected at predetermined injection angles θ1 and θ2. This indicates that the process gas G is diffused while implementing a flow field forming a vortex, instead of being simply diffused in the chamber 100. Accordingly, an effect of improved dispersion due to increased mixing of the process gas G in the chamber 100 can be expected.

Figure 5:
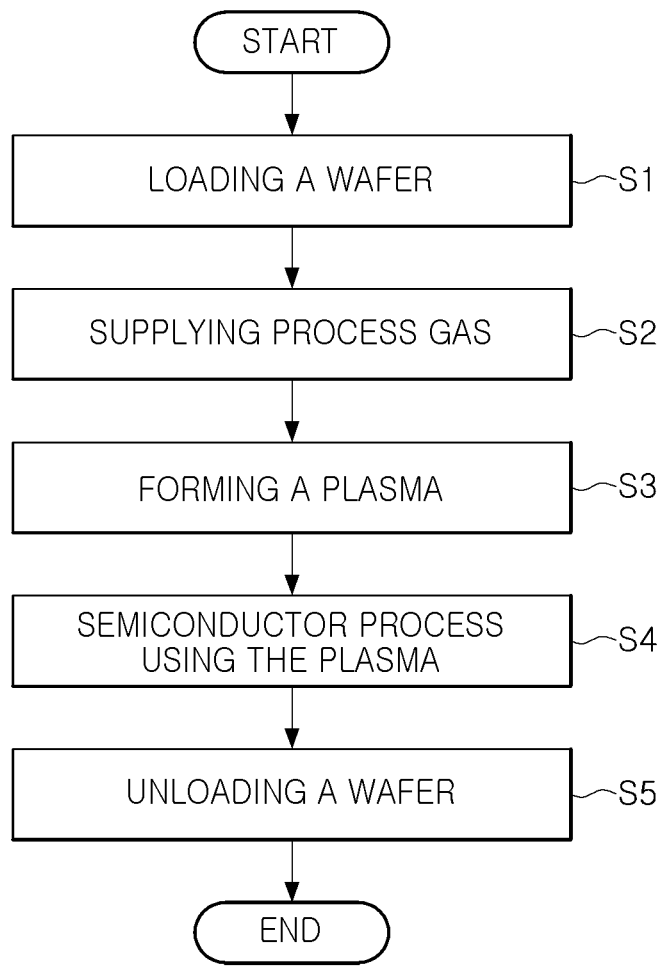
FIG. 5 is a flow chart illustrating a semiconductor process using a plasma in a plasma processing apparatus according to example embodiments.

FIG. 5 is a flow chart illustrating a semiconductor process using plasma in a plasma processing apparatus according to example embodiments.

Referring to FIGS. 1 and 5, the plasma processing apparatus 10 according to the present example embodiment can be used in a semiconductor process employing plasma.

The wafer W can be loaded (S1). For example, the wafer W may be chucked to the support member 120 inside the chamber 100.

The process gas G can be supplied (S2). The process gas G stored in a tank 500 may be supplied into the chamber 100 through the supply pipe 510. A type of the supply gas G may vary depending on the semiconductor process. The supply pipe 510 may connect the tank 500 and the gas injector 300. The process gas G supplied from the tank 500 to the gas injector 300 may be injected into the internal space 110 of the chamber 100. According to an example embodiment of the present inventive concept, the process gas G is injected in different directions, that is, in a lateral or horizontal direction and a vertical direction, through the plurality of distribution nozzles and the plurality of injection nozzles, thereby increasing mixing of the process gas G in the chamber 100.

A plasma can be formed (S3). The plasma may be formed by applying a voltage through the plasma power supply 140 to the ICP antenna 130 while the process gas G is being supplied into the internal space 110 of the chamber 100. As illustrated in FIG. 2B, as the gas injected by the gas hole 340 of the gas injector 300 fills the inside of the gap GP, the plasma formed in the internal space 110 of the chamber 100 can be prevented from being flowing into the gap GP.

A semiconductor process using the plasma can be carried out (S4). The semiconductor process may be, for example, an etching process or a deposition process.

After the semiconductor process is carried out, the supply of the process gas G and the voltage application to the plasma power supply 140 can be stopped. Subsequently, the wafer W can be unloaded (S5).

As set forth above, according to an example embodiment of the present inventive concept, a plasma processing apparatus including a window plate capable of implementing uniform dispersion of a process gas injected inside a chamber and a gas injector can be provided. A plasma processing apparatus that helps prevent generation of process particles between the window plate and the gas injector can be provided.

Various advantages and beneficial effects of the present disclosure are not limited to the above descriptions and may be easily understood in the course of describing a specific example embodiment.

While example embodiments have been shown and described above, it will be apparent to those skilled in the art that modifications and variations could be made without departing from the scope of the present inventive concept as defined by the appended claims.

What is claimed is:

1. A plasma processing apparatus, comprising:
a chamber;
a support member inside the chamber;
a window plate at an upper portion of the chamber and facing the support member, wherein the window plate comprises a window plate body and a fastening hole penetrating the window plate body, wherein the fastening hole comprises a lower fastening hole portion having a first width and an upper fastening hole portion having a second width, greater than the first width; and
a gas injector comprising a first body having a plurality of distribution nozzles configured to distribute process gas and a second body having an accommodating groove to which the first body is fastened and a plurality of injection nozzles configured to inject the process gas distributed by the plurality of distribution nozzles into an internal space of the chamber,
wherein the second body comprises a first portion disposed inside the upper fastening hole portion, a second portion disposed inside the lower fastening hole portion, and a third portion disposed below the window plate, wherein the second portion of the second body comprises a gas hole extending from the accommodating groove to an external side surface of the second portion of the second body.

2. The plasma processing apparatus of claim 1, wherein the accommodating groove comprises a first accommodating groove disposed in a central portion of the second body and a second accommodating groove surrounding the first accommodating groove, wherein a bottom surface of the first accommodating groove is located on a lower vertical level as compared to a bottom surface of the second accommodating groove, and the gas hole extends from the second accommodating groove to the external side surface of the second portion of the second body.

3. The plasma processing apparatus of claim 2, wherein the first accommodating groove comprises a first space configured to accommodate the process gas in a lower portion of the first body, the second accommodating groove comprises a second space configured to accommodate the process gas in the lower portion of the first body, and the gas hole extends from the second space to the external side surface of the second portion of the second body.

4. The plasma processing apparatus of claim 2, wherein the plurality of injection nozzles comprise first injection nozzles radially extending from the first accommodating groove to an external side surface of the third portion of the second body, and second injection nozzles downwardly extending from the second accommodating groove to a lower surface of the third portion of the second body.

5. The plasma processing apparatus of claim 4, wherein the first injection nozzles form an acute angle with respect to a virtual straight line, based on a point in which the virtual straight line that is perpendicular to a central axis of the first accommodating groove and extends from the central axis of the first accommodating groove to an internal side surface of the first accommodating groove.

6. The plasma processing apparatus of claim 4, wherein the second injection nozzles form an acute angle with respect to a virtual straight line, parallel to a central axis of the first accommodating groove, and extend at the acute angle from the second accommodating groove toward the lower surface of the third portion of the second body.

7. The plasma processing apparatus of claim 1, further comprising a gap between the external side surface of the second portion of the second body and an internal side surface of the window plate, wherein the gas hole fluidly connects the accommodating groove and the gap.

8. The plasma processing apparatus of claim 1, wherein each of the first to third portions of the second body have circumferences and different diameters.

9. The plasma processing apparatus of claim 8, wherein the first portion of the second body has a first diameter substantially the same as the second width of the upper fastening hole portion.

10. The plasma processing apparatus of claim 9, wherein a second diameter of the second portion of the second body is smaller than the first diameter of the first portion of the second body and is also smaller than the first width of the lower fastening hole portion.

11. The plasma processing apparatus of claim 1, wherein the window plate further comprises a protective layer configured to cover a lower surface of the window plate body.

12. The plasma processing apparatus of claim 11, wherein the protective layer comprises a material the same as a material of the gas injector.

13. A plasma processing apparatus, comprising:
a chamber;
a support member inside the chamber;
a window plate at an upper portion of the chamber and facing the support member,
wherein the window plate comprises a window plate body and a fastening hole penetrating the window plate body;
a gas injector comprising a first body having a plurality of distribution nozzles configured to distribute process gas and a second body having a first accommodating groove to which the first body is fastened, a second accommodating groove surrounding the first accommodating groove, and a plurality of injection nozzles configured to inject the process gas distributed by the plurality of distribution nozzles into an internal space of the chamber; and
a gap between the gas injector and the window plate,
wherein the second body comprises an upper portion disposed in the fastening hole of the window plate, and a lower portion disposed below the window plate,
the gap is between an external side surface of the upper portion of the second body and an internal side surface of the window plate, and
the upper portion of the second body comprises a gas hole extending from the second accommodating groove to the external side surface of the upper portion of the second body to connect the second accommodating groove and the gap.

14. The plasma processing apparatus of claim 13, wherein the injection nozzles comprise first injection nozzles radially extending from the first accommodating groove to an external side surface of the lower portion of the second body, and second injection nozzles downwardly extending from the second accommodating groove to a lower surface of the lower portion of the second body.

15. The plasma processing apparatus of claim 14, wherein the first accommodating groove comprises a first space configured to accommodate the process gas between the first body and the second body, and the second accommodating groove comprises a second space configured to accommodate the process gas between the first body and the second body.

16. The plasma processing apparatus of claim 14, wherein the gas hole extends from a second space to the external side surface of the upper portion of the second body to be connected to the gap.

17. The plasma processing apparatus of claim 13, wherein a width of the gap is in a range of about 0.1 mm to about 1.0 mm.

18. The plasma processing apparatus of claim 13, wherein a bottom surface of the first accommodating groove is positioned at a lower vertical level than a bottom surface of the second accommodating groove.

19. A plasma processing apparatus, comprising:
a chamber;
a support member inside the chamber;
a window plate at an upper portion of the chamber, facing the support member and comprising a fastening hole;

a gas injector fastened to the fastening hole and comprising a first body and a second body having an accommodating groove to which the first body is fastened; and a gap between the gas injector and the window plate, wherein the gas injector comprises an upper portion disposed inside the fastening hole of the window plate and a lower portion disposed below the window plate, the gas injector further comprising a gas hole extending from the accommodating groove to an external side surface of the upper portion of the second body to fluidly connect the accommodating groove and the gap, wherein the accommodating groove comprises a first accommodating groove disposed in a central portion of the second body and a second accommodating groove surrounding the first accommodating groove, wherein a bottom surface of the first accommodating groove is positioned at a lower vertical level than a bottom surface of the second accommodating groove, and the gas hole extends from the second accommodating groove to the external side surface of the upper portion of the second body to fluidly connect the second accommodating groove and the gap.

* * * * *